(12) United States Patent
Liao

(10) Patent No.: US 8,176,973 B2
(45) Date of Patent: May 15, 2012

(54) FINNED HEAT PIPE COMPRISING CONCENTRIC PIPES OF DIFFERENT LENGTH

(76) Inventor: Wen-Chih Liao, Keelong (TW)

(*) Notice: Subject to any disclaimer, the term of this patent is extended or adjusted under 35 U.S.C. 154(b) by 807 days.

(21) Appl. No.: 12/205,986

(22) Filed: Sep. 8, 2008

(65) Prior Publication Data

US 2009/0071637 A1 Mar. 19, 2009

(30) Foreign Application Priority Data

Sep. 14, 2007 (TW) .............................. 96215535 U

(51) Int. Cl.
*H01L 23/487* (2006.01)
*F28F 1/20* (2006.01)
*H05K 7/20* (2006.01)

(52) U.S. Cl. .................... 165/104.26; 165/181; 361/700
(58) Field of Classification Search .................. 361/700; 165/104.21, 104.26
See application file for complete search history.

(56) References Cited

U.S. PATENT DOCUMENTS

| | | | | |
|---|---|---|---|---|
| 2,499,736 A | * | 3/1950 | Af Kleen | 62/59 |
| 3,209,819 A | * | 10/1965 | Leclercq | 165/155 |
| 7,048,039 B2 | * | 5/2006 | Sarraf | 165/104.21 |
| 7,051,794 B2 | * | 5/2006 | Luo | 165/104.26 |
| 2005/0252951 A1 | | 11/2005 | Liao | |
| 2006/0201656 A1 | * | 9/2006 | Lai et al. | 165/104.26 |

FOREIGN PATENT DOCUMENTS

TW 200533455 10/2005

* cited by examiner

*Primary Examiner* — Judy Swann
*Assistant Examiner* — Jason Thompson
(74) *Attorney, Agent, or Firm* — Rabin & Berdo, P.C.

(57) ABSTRACT

A heat sink assembly in accordance with the present invention increases heat dissipation area, improves heat dissipation efficiency and comprises a base, a core pipe, an outer pipe, a top cover and a working fluid. The base has a top surface. The core pipe is mounted securely on and protrudes from the top surface with an air-tight fit and comprises an inner surface, an outer surface, a wick, multiple holes and a top. The wick is formed on the inner and outer surface. The outer pipe is mounted securely on and protrudes from the base concentrically around the core pipe and comprises an inner surface, an outer surface, a wick and a top. The wick is formed on the inner surface. The holes are formed around the core pipe away from the base. The top cover closes the top of the core pipe and the top of the outer pipe.

13 Claims, 18 Drawing Sheets

US 8,176,973 B2

FINNED HEAT PIPE COMPRISING CONCENTRIC PIPES OF DIFFERENT LENGTH

FIELD OF THE INVENTION

A finned heat pipe comprising concentric pipes of different length in accordance with the present invention is a heat pipe and particularly a heat pipe assembly having a core pipe and an outer pipe.

BACKGROUND OF THE INVENTION

Recently, performance of electronic equipment has increased dramatically with a commensurate reduction in equipment size. Higher performance has resulted in more internal heat and higher operating temperature. Without effective dissipation of the increased heat, reliability and life span of the associated electronic equipment will be adversely affected.

To dissipate heat from electronic equipment, conventional heat sinks and fans are used. Conventional heat sinks use fins to increase the surface area so more heat can be transferred and dissipated. However, smaller electronic equipment size limits the number and size of fins that can be used to effectively dissipate heat generated by the electronic equipment. Therefore, using a heat pipe is necessary for heat dissipation in small, high performance electronic equipment.

A conventional heat pipe uses a single-wall tube to dissipate heat generated by the electronic equipment. As heat generated increases and size decreases in modern, high performance, high power electronic devices, the conventional heat pipe is not adequate to dissipate heat generated.

SUMMARY OF THE INVENTION

The objective of the present invention is to increase heat dissipation area and to improve heat dissipation efficiency of a heat pipe for dissipating heat more quickly and uniformly.

A finned heat pipe comprising concentric pipes of different length in accordance with the present invention increases heat dissipation area, improves heat dissipation efficiency and comprises a base, a core pipe, an outer pipe, a top cover and a working fluid. The base has a top surface. The core pipe is copper-silver alloy brazed securely on and protrudes from the top surface with an air-tight fit and comprises an inner surface, an outer surface, a wick, multiple holes and an open top. The wick is formed on the inner and outer surface. The outer pipe is copper-silver alloy brazed securely on and protrudes from the base concentrically around the core pipe and comprises an inner surface, an outer surface, a wick and an open top. The wick is formed on the inner surface. The holes are formed around the core pipe away from the base. The top cover is copper-silver alloy brazed securely on and closes the open tops of the core pipe and the outer pipe. The working fluid is pure water and is injected into the core pipe and the outer pipe in the presence of a vacuum.

DETAILED DESCRIPTION OF THE PRESENT INVENTION

Figure 1:
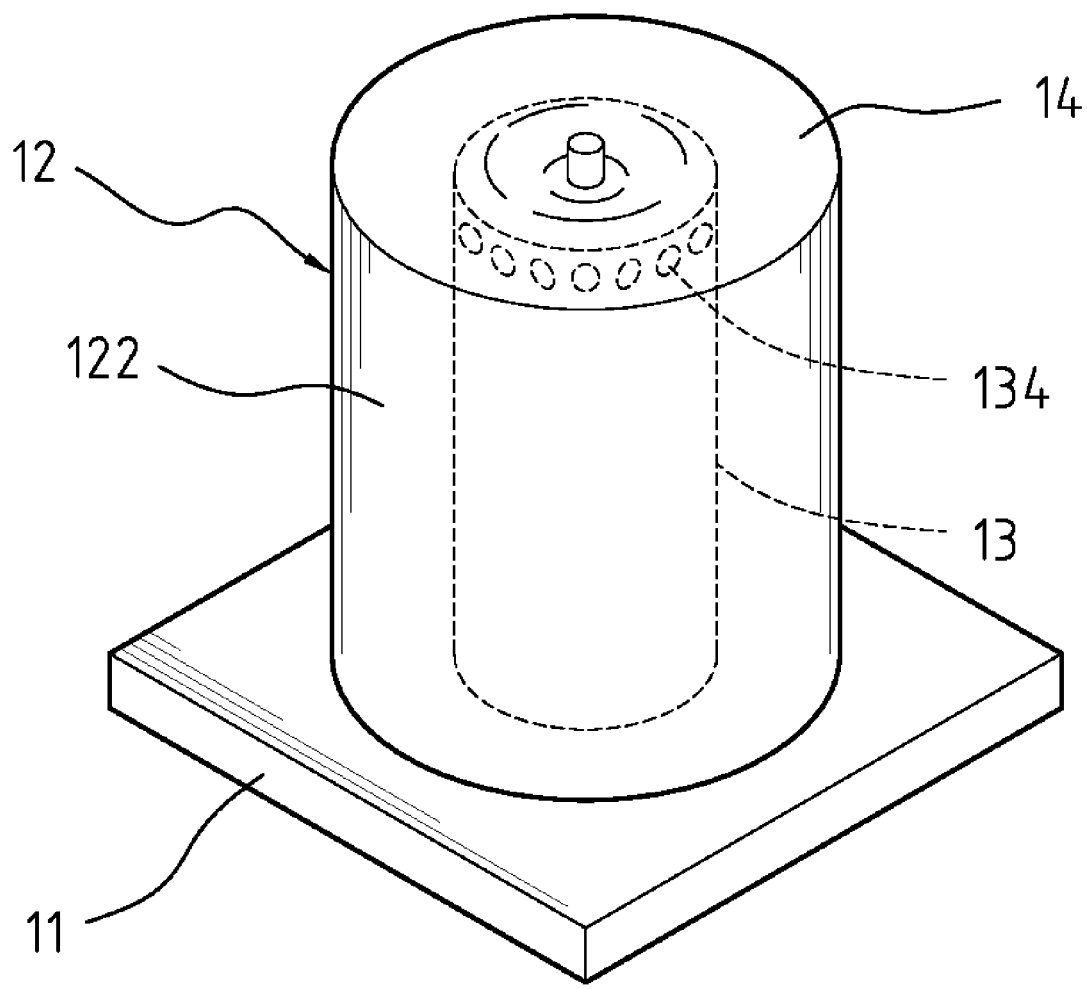
FIG. 1 is a perspective view of a first embodiment of a finned heat pipe comprising concentric pipes of different length in accordance with the present invention.

With reference to FIGS. 1, 3, 5 and 9, a finned heat pipe comprising concentric pipes of different length in accordance with the present invention comprises a base (11), a core pipe (13), an outer pipe (12), a top cover (14, 135), a working fluid and multiple optional fins (15).

Figure 2:
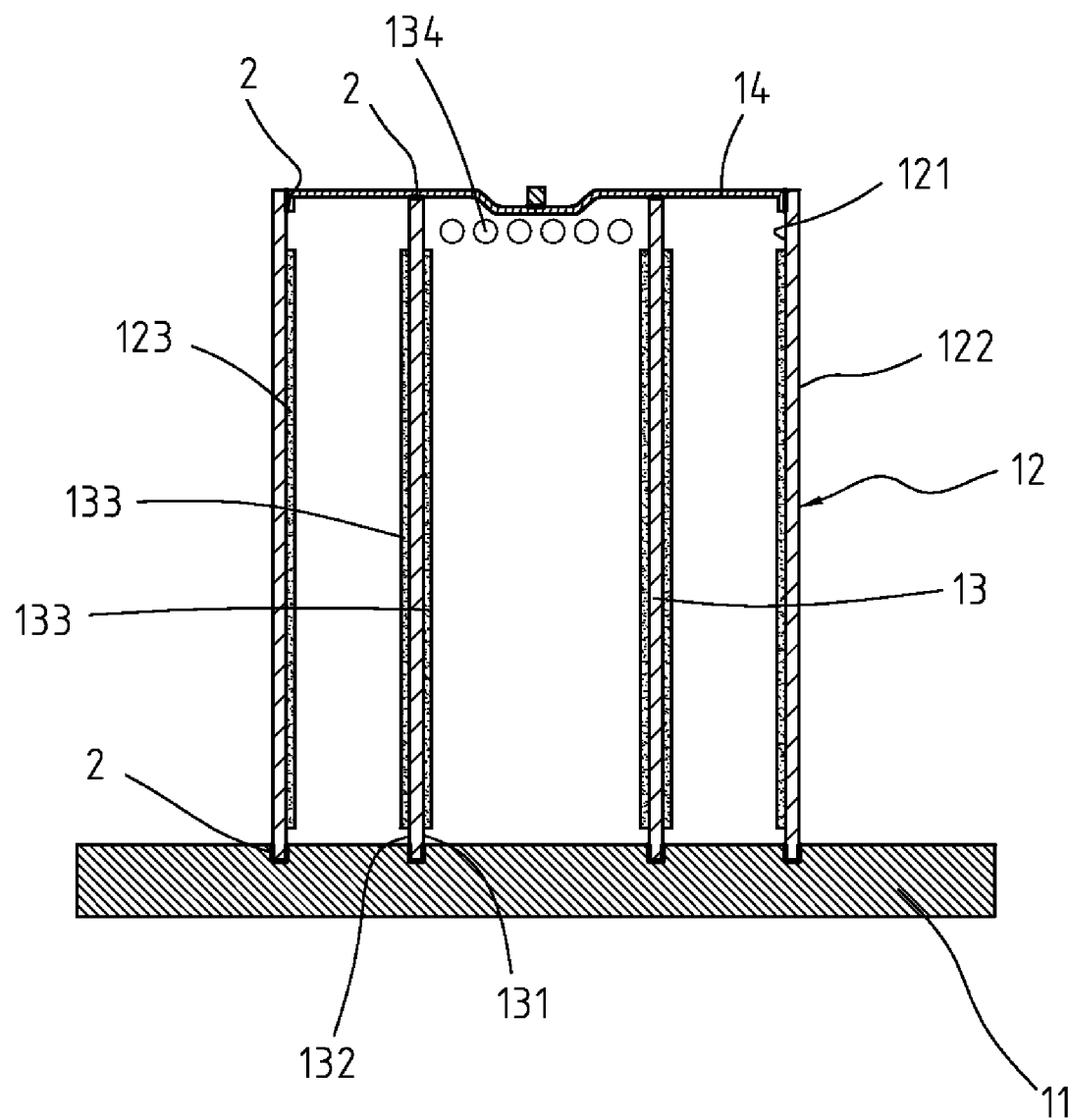
FIG. 2 is a cross sectional side view of the finned heat pipe comprising concentric pipes of different length in FIG. 1.
Figure 3:
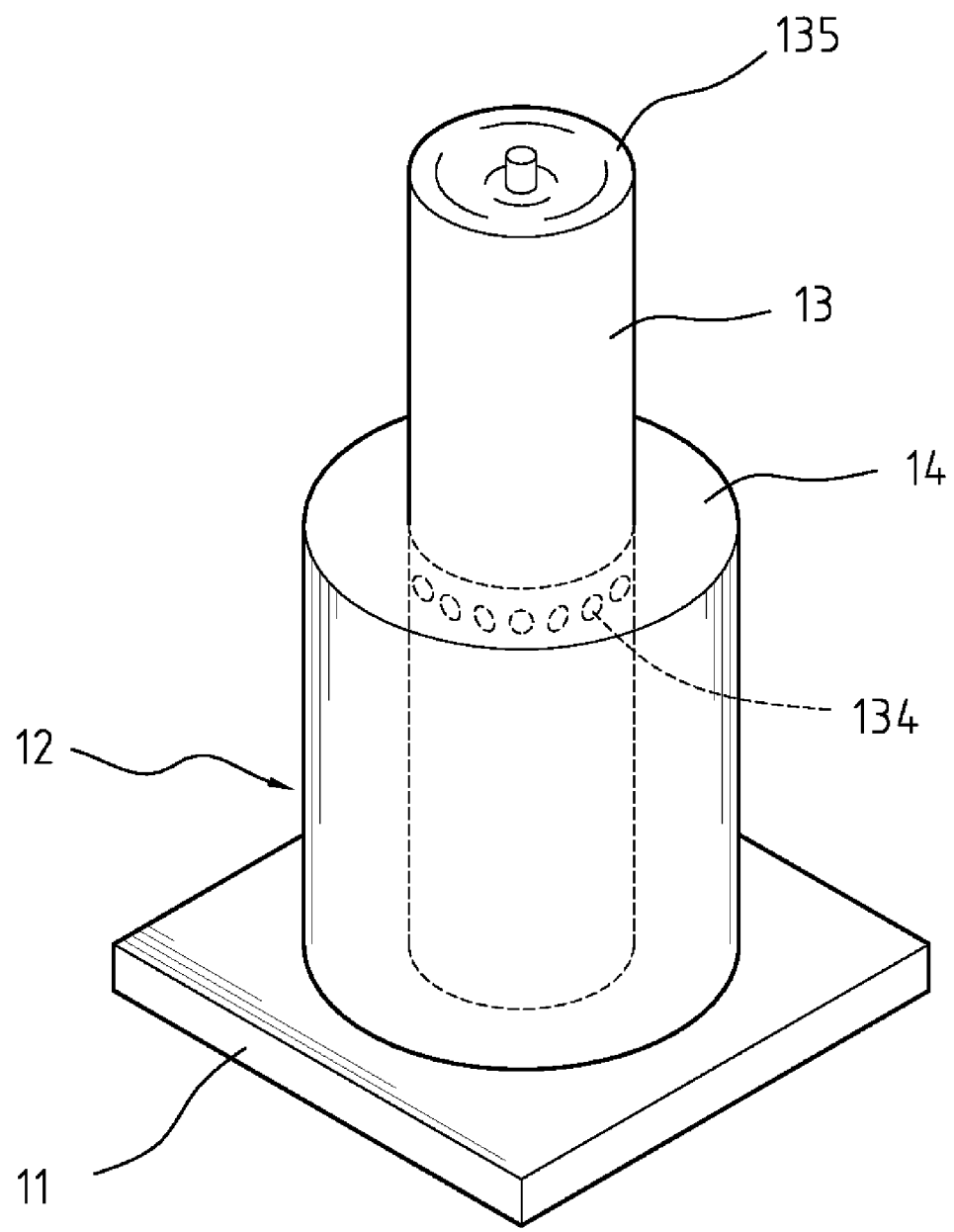
FIG. 3 is a perspective view of a second embodiment of a finned heat pipe comprising concentric pipes of different length in accordance with the present invention.

With further reference to FIG. 2, the base (11) is a plate of highly conductive metal and has a top surface and two concentric circular grooves. The concentric circular grooves are formed in the top surface and comprise an inner groove and an outer groove.

The core pipe (13) is cylindrical and a highly conductive metal, is copper-silver alloy brazed securely in the inner groove of the base (11) with a gas-tight fit, protrudes up from the base (11) and comprises an inner surface (131), an outer surface (132), an open top, multiple holes (134) and a wick (133). The holes (134) are formed around the core pipe (13) away from the base (11). The wick (133) is formed on the inner surface (131) and outer surface (132) between but not in contact with the base (11) and the open top and may be a sintered-type, groove-type, or mesh-type wick. The sintered-type wick is formed by sintering a large amount of metallic powder consistent with the core pipe (13) on the inner surface (131) and the outer surface (132). The groove-type wick is multiple grooves formed longitudinally on the inner surface (131) and the outer surface (132) of the core pipe (13). The mesh-type wick is a fine metallic mesh consistent with the core pipe (13) and is mounted on the inner surface (131) and the outer surface (132).

The outer pipe (12) is cylindrical and a highly conductive metal, is copper-silver alloy brazed securely in the outer groove of the base (11) with a gas-tight fit, protrudes up from the base (11) concentric with the core pipe (13) and comprises an inner surface (121), an outer surface (122), an open top and a wick (123). The open top is just above the multiple holes (134), may be even with the open top of the core pipe (13) and may be lower than the open top of the core pipe (13). The wick (123) is formed on the inner surface (121) between but not in contact with the base (11) and the open top and may be a sintered-type, groove-type, or mesh-type wick. The sintered-type wick is formed by sintering a large amount of metallic powder consistent with the outer pipe (12) on the inner surface (121). The groove-type wick is multiple grooves formed longitudinally on the inner surface (121) of the outer pipe (12). The mesh-type wick is a fine metallic mesh consistent with the outer pipe (12) and is mounted on the inner surface (121).

The top cover (135, 14) is copper-silver alloy brazed securely on and closes the open tops of the core pipe (13) and the outer pipe (12).

The working fluid is pure water and is injected into the core pipe (13) and the outer pipe (12) in the presence of a vacuum. Heat absorbed through the base (11) from an electronic device on which the finned heat pipe comprising concentric pipes of different length is mounted causes the pure water to vaporize, form water vapor and rise in the core pipe (13) and the outer pipe (12). The water vapor permeates the wick (123, 133). Contact with the core pipe (13) and the outer pipe (12) causes heat to dissipate, the water vapor to condense into pure water and the pure water to return to the base (11) where the cycle is repeated. Therefore, heat absorbed by the finned heat pipe comprising concentric pipes of different length in accordance with the present invention is dissipated more quickly and uniformly due to increased heat dissipation areas of the core pipe (13).

Figure 4:
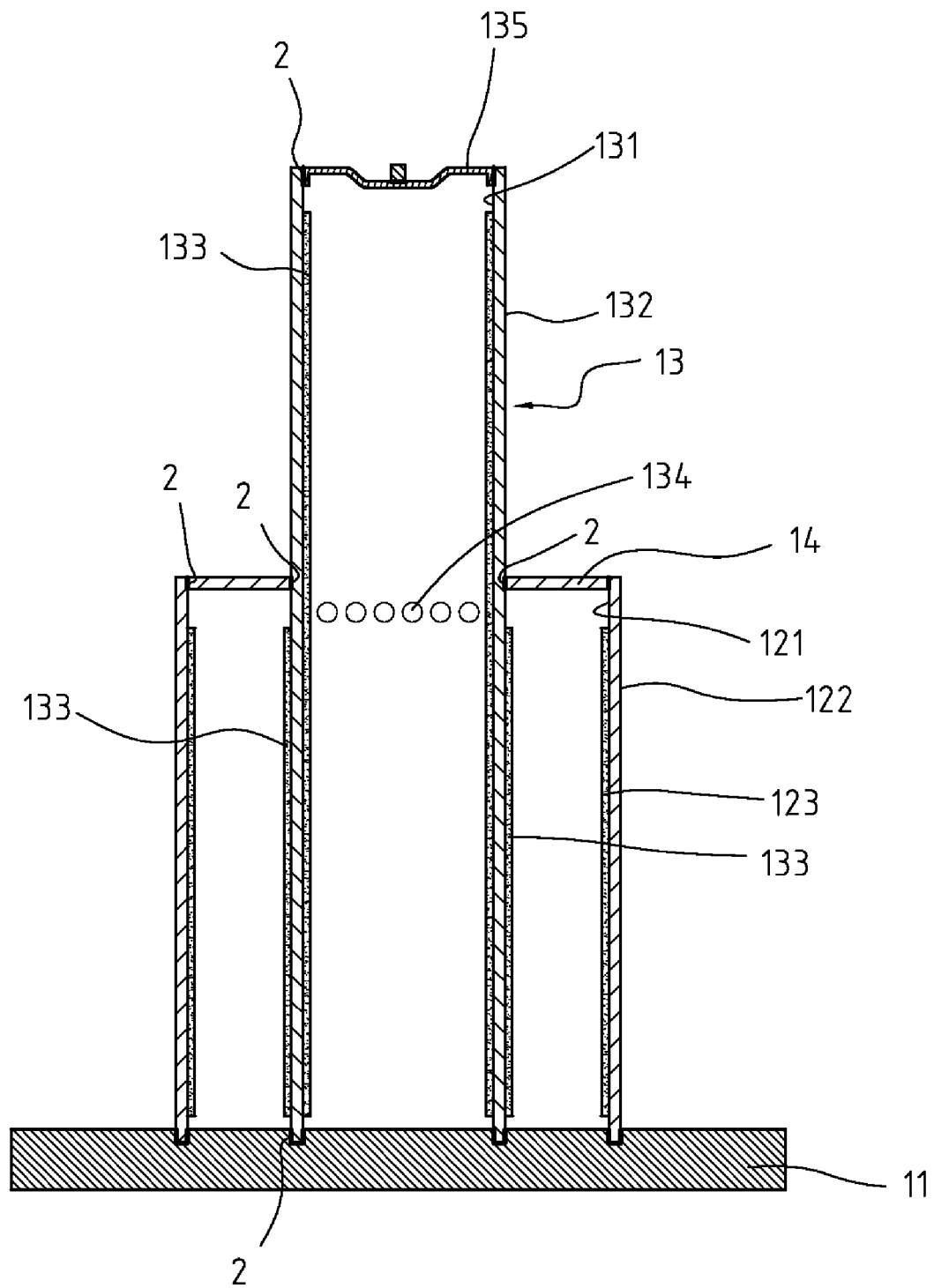
FIG. 4 is a cross sectional side view of the finned heat pipe comprising concentric pipes of different length in FIG. 3.
Figure 5:
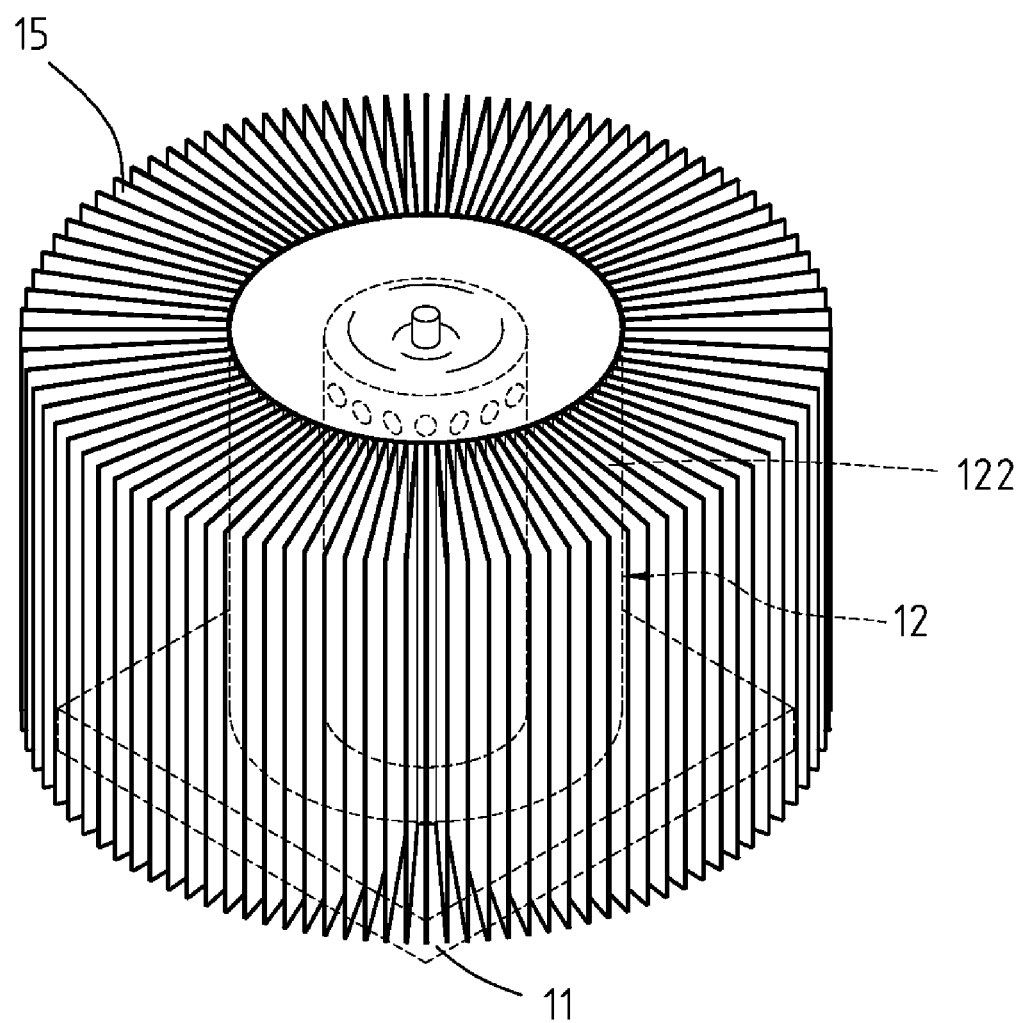
FIG. 5 is a perspective view of the finned heat pipe comprising concentric pipes of different length in FIG. 1 with multiple radial fins.

With further reference to FIGS. 2 and 4, the heat sink assemblies may be assembled with copper-silver alloy filler (2) in a brazing device. The brazing device is disclosed in an application submitted in Taiwan on Apr. 13, 2004 and in American on Apr. 11, 2005. The application number in Taiwan is 093110301, and the application number in American is Ser. No. 11/103,700. A process of using the brazing device for manufacturing the heat sink assemblies meets the requirement of Restriction of Hazardous Substance (RoHS). The brazing device comprises a heating unit, a brazing unit, and a cooling unit. The brazing unit is connected to the heating unit, and the cooling unit is connected to the brazing unit.

The manufacturing process comprises multiple acts. First, the copper-silver alloy filler (2) is placed at a junction of the base (11) and outer pipe (12), a junction of the base (11) and core pipe (13), a junction of the top cover (14) and the outer pipe (12), and junctions of the top cover (14, 135) and core pipe (13) to seal and assemble them. They are become assembled components.

Subsequently, the assembled core pipe (13), outer pipe (12), top cover (135, 14) and base (11) are preheated in the heating unit are preheated in the heating unit to burn up most of the oxygen to remove impurities adhered on the assembled components.

Then, the assembled components are heated in the brazing unit in the presence of an inert gas to the melting point of copper-silver alloy filler (2) to evacuate any remaining oxygen to obviate oxidation of the assembled components and to make the copper-silver alloy filler (2) melt and spread at the junctions of the assembled components.

Finally, the assembled the core pipe (13), outer pipe (12), top cover (135, 14) and base (11) are cooled in the cooling unit to solidify the liquid copper-silver alloy filler (2) at the junctions to form a finished finned heat pipe comprising concentric pipes of different length.

Based on a thermal shock testing between −80° C. and 150° C. and a high temperature testing at 300° C. for 72 hours, the finned heat pipe comprising concentric pipes of different length can maintain its heat conductivity during normal operation.

Figure 6:
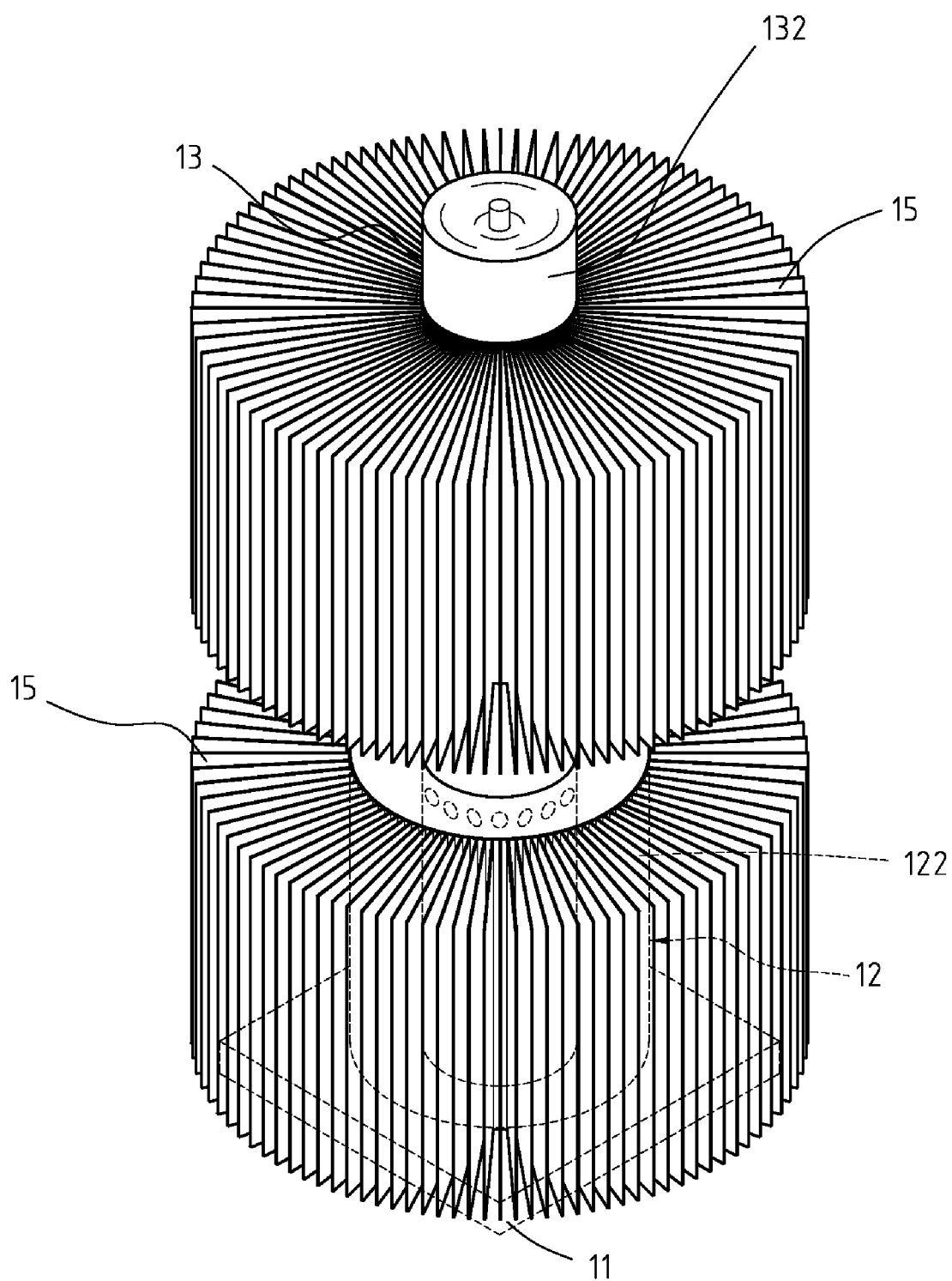
FIG. 6 is a perspective view of the finned heat pipe comprising concentric pipes of different length in FIG. 3 with multiple radial fins.
Figure 7:
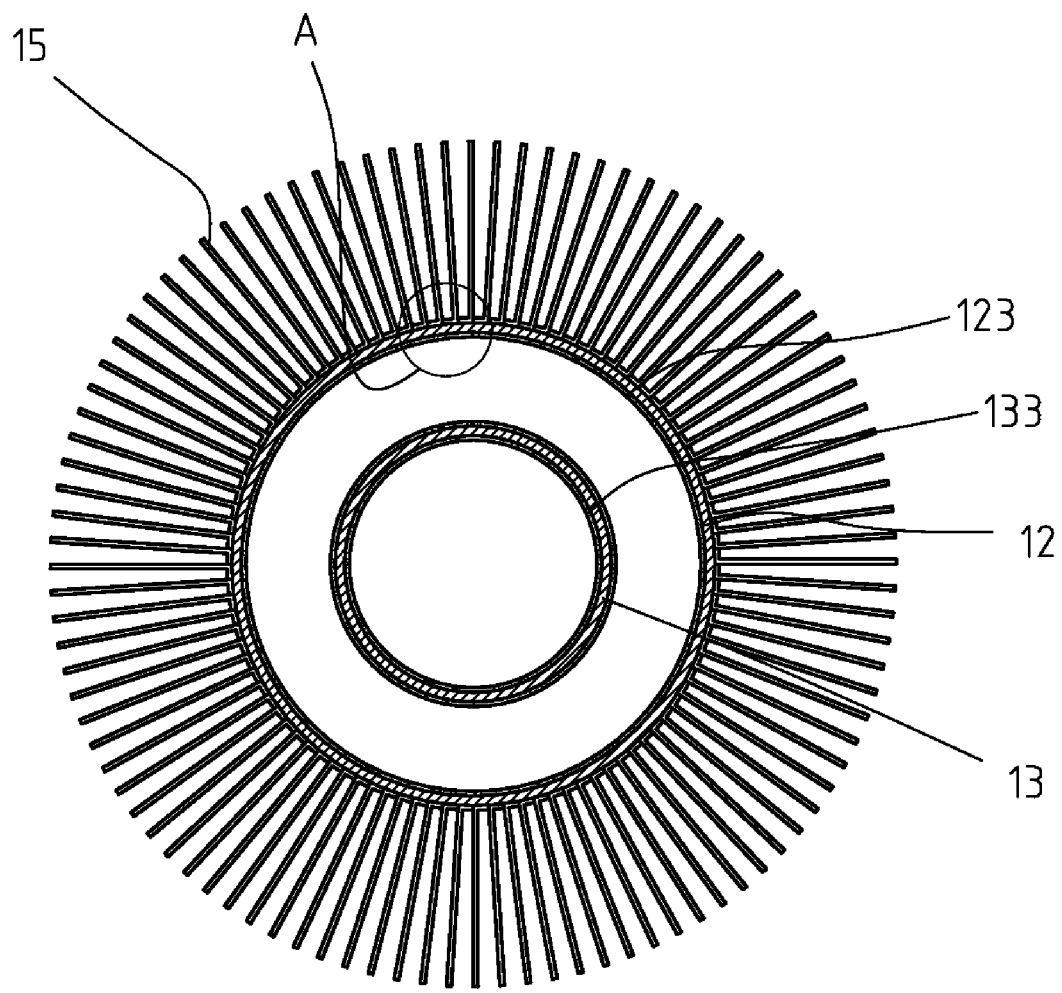
FIG. 7 is a cross sectional top view of the finned heat pipe comprising concentric pipes of different length in FIG. 5.
Figure 8:
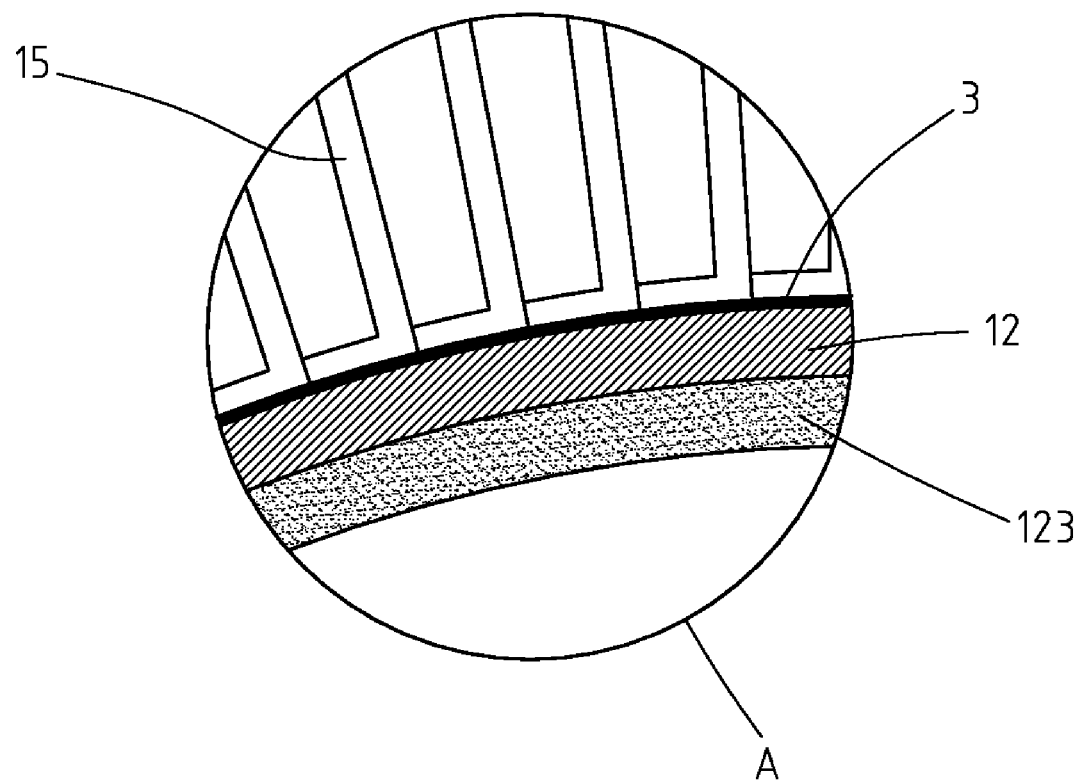
FIG. 8 is an enlarged cross sectional top view of the finned heat pipe comprising concentric pipes of different length in FIG. 7 inside circle A with a sintered wick.
Figure 9:
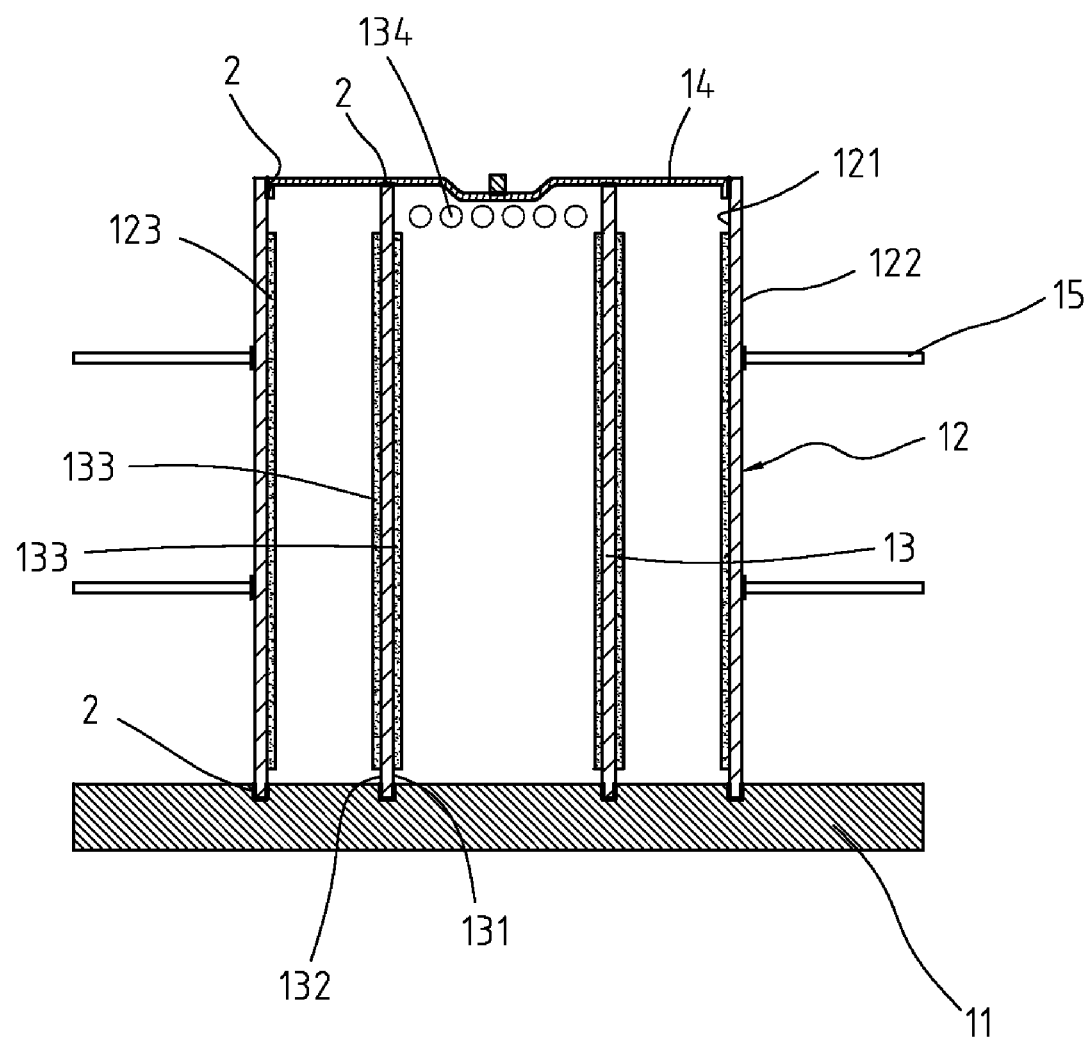
FIG. 9 is a cross sectional side view of the finned heat pipe comprising concentric pipes of different length in FIG. 1 with multiple circular fins.
Figure 10:
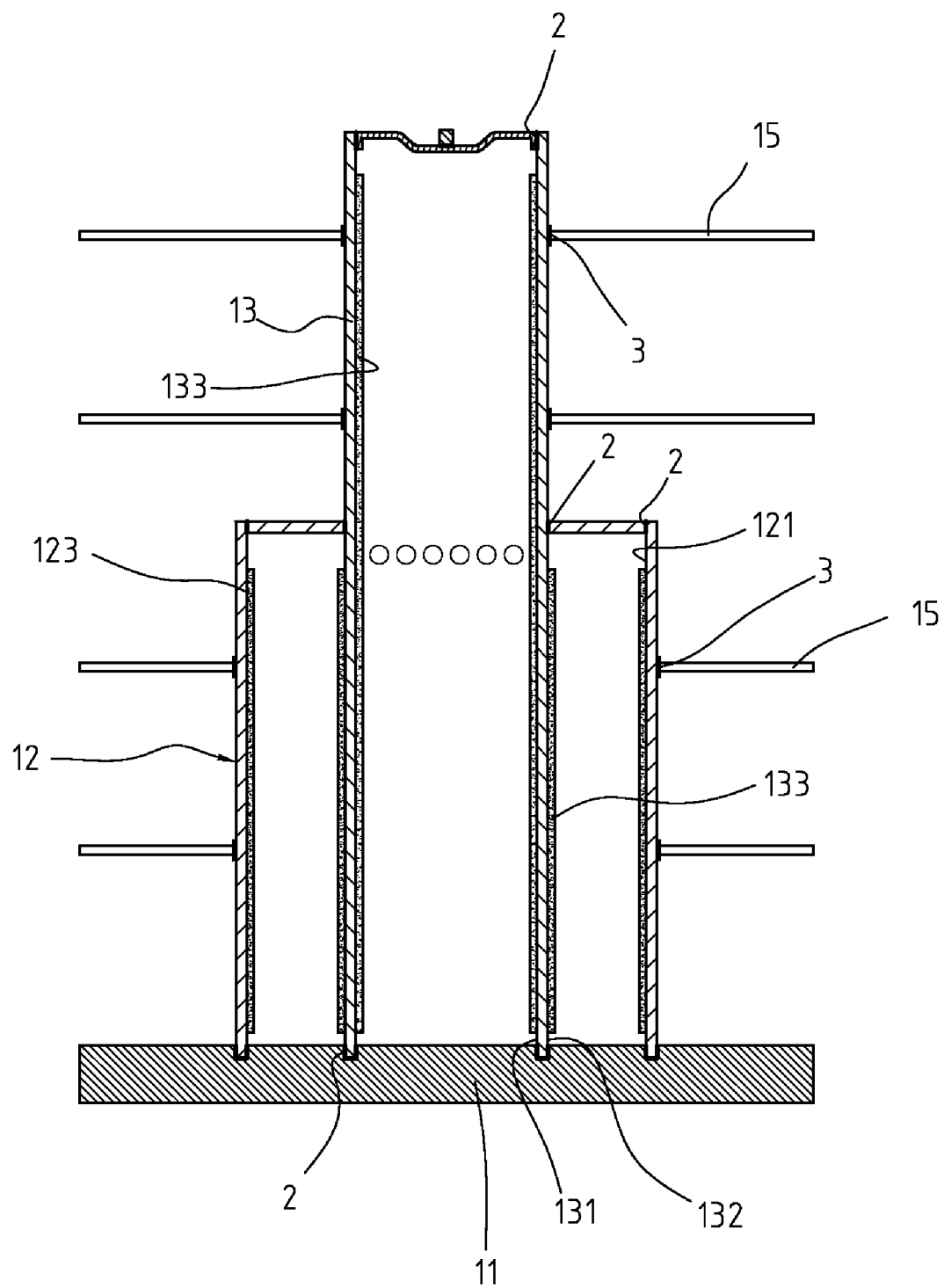
FIG. 10 is a cross sectional side view of the finned heat pipe comprising concentric pipes of different length in FIG. 3 with multiple circular fins.
Figure 11:
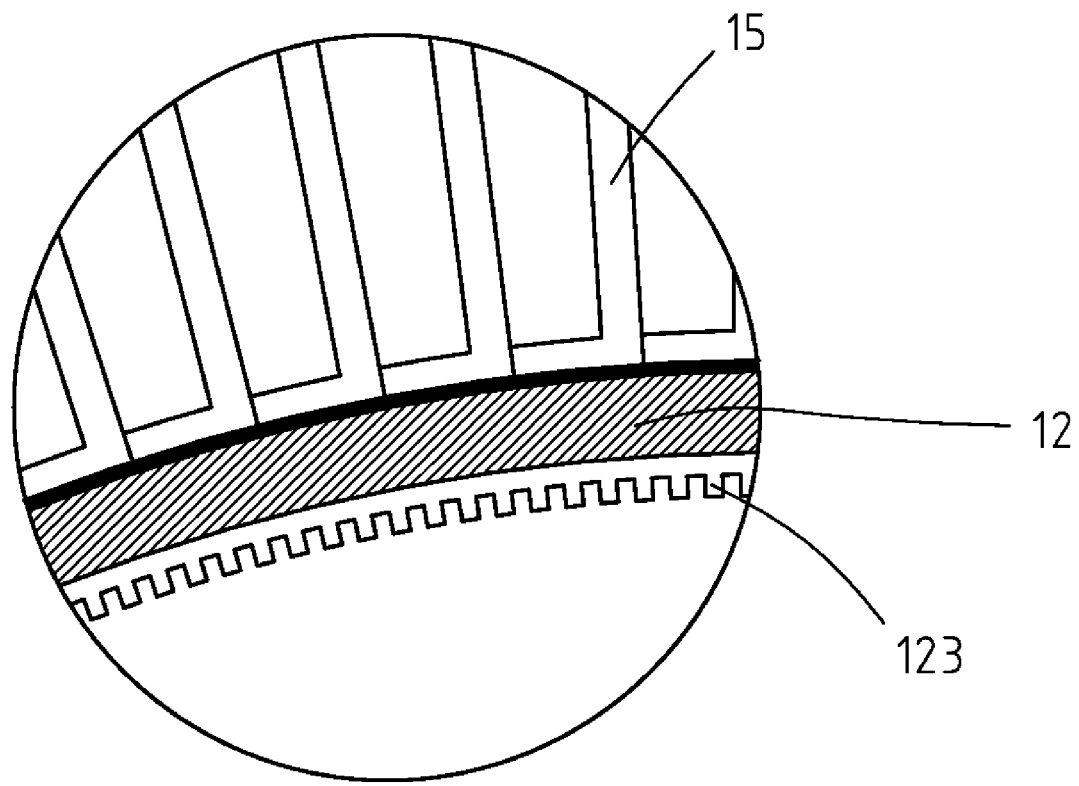
FIG. 11 is an enlarged cross sectional top view of the finned heat pipe comprising concentric pipes of different length in FIG. 7 inside circle A with a groove-type wick.
Figure 12:
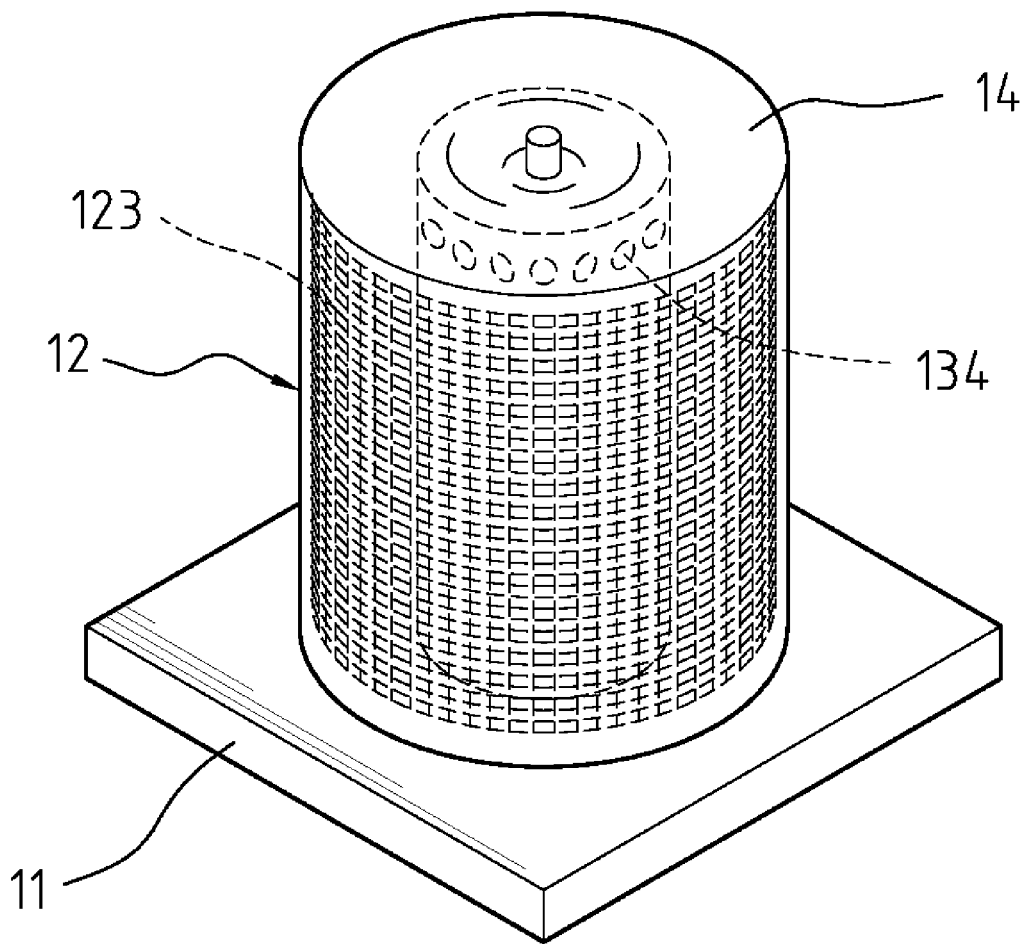
FIG. 12 is a transparent perspective view of the finned heat pipe comprising concentric pipes of different length in FIG. 1 with a mesh-type wick.
Figure 13:
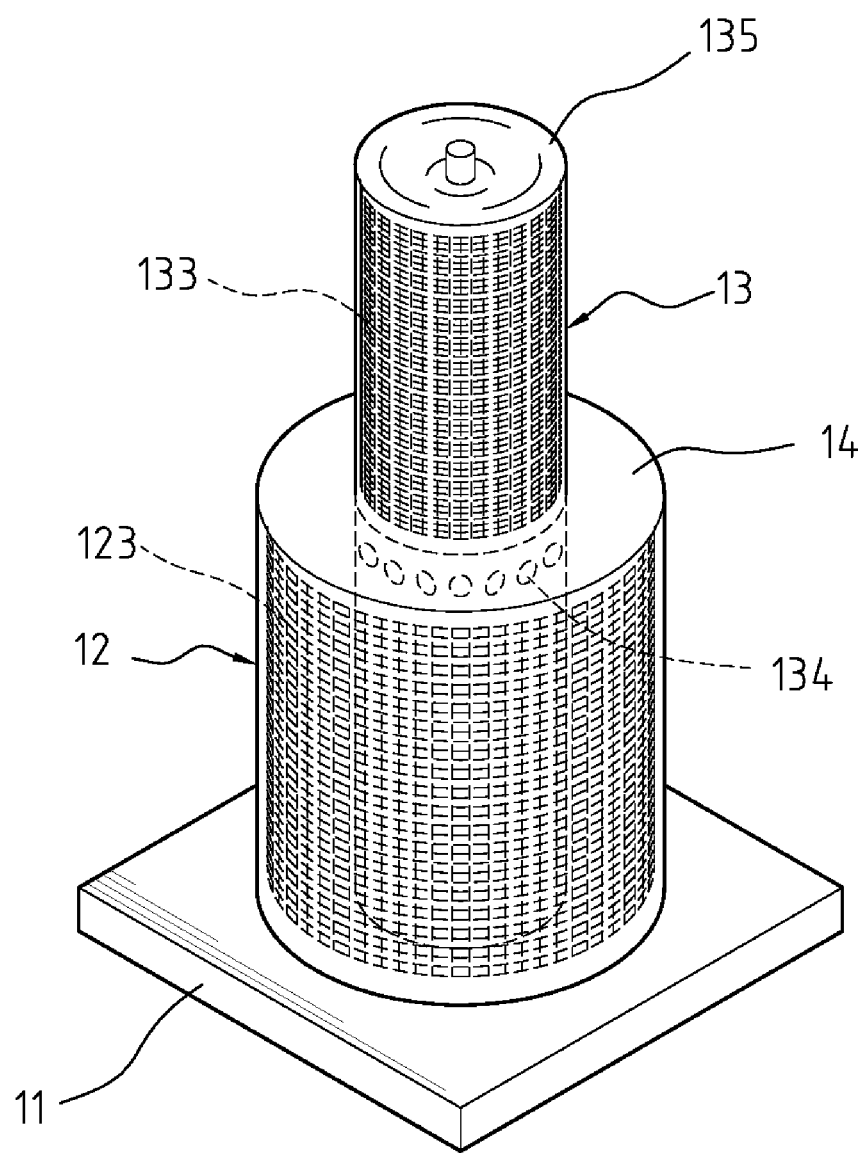
FIG. 13 is a transparent perspective view of the finned heat pipe comprising concentric pipes of different length in FIG. 3 with a mesh-type wick.

With further reference to FIGS. 6, 7, and 8, the fins (15) may be longitudinal radial fins or circular fins and are L-shaped. Each fin (15) comprises an elongated fin and a foot and fins performing soldering steps and protrudes radially from the outer surface (122, 132) of the outer pipe (12), the core pipe (13) or both. The foot soldering to the outer surface (122, 132) with a low temperature tin filler (3) with a process that meets the RoHS requirement. The low temperature tin filler (3) melts and effectively solders the fins (15) at a temperature of 150° C. to 350° C. The finned heat pipe comprising concentric pipes of different length finished in the brazing device between 600° C. and 1000° C. will not be cracked after the fins (15) are soldering consequently.

Figure 14A:
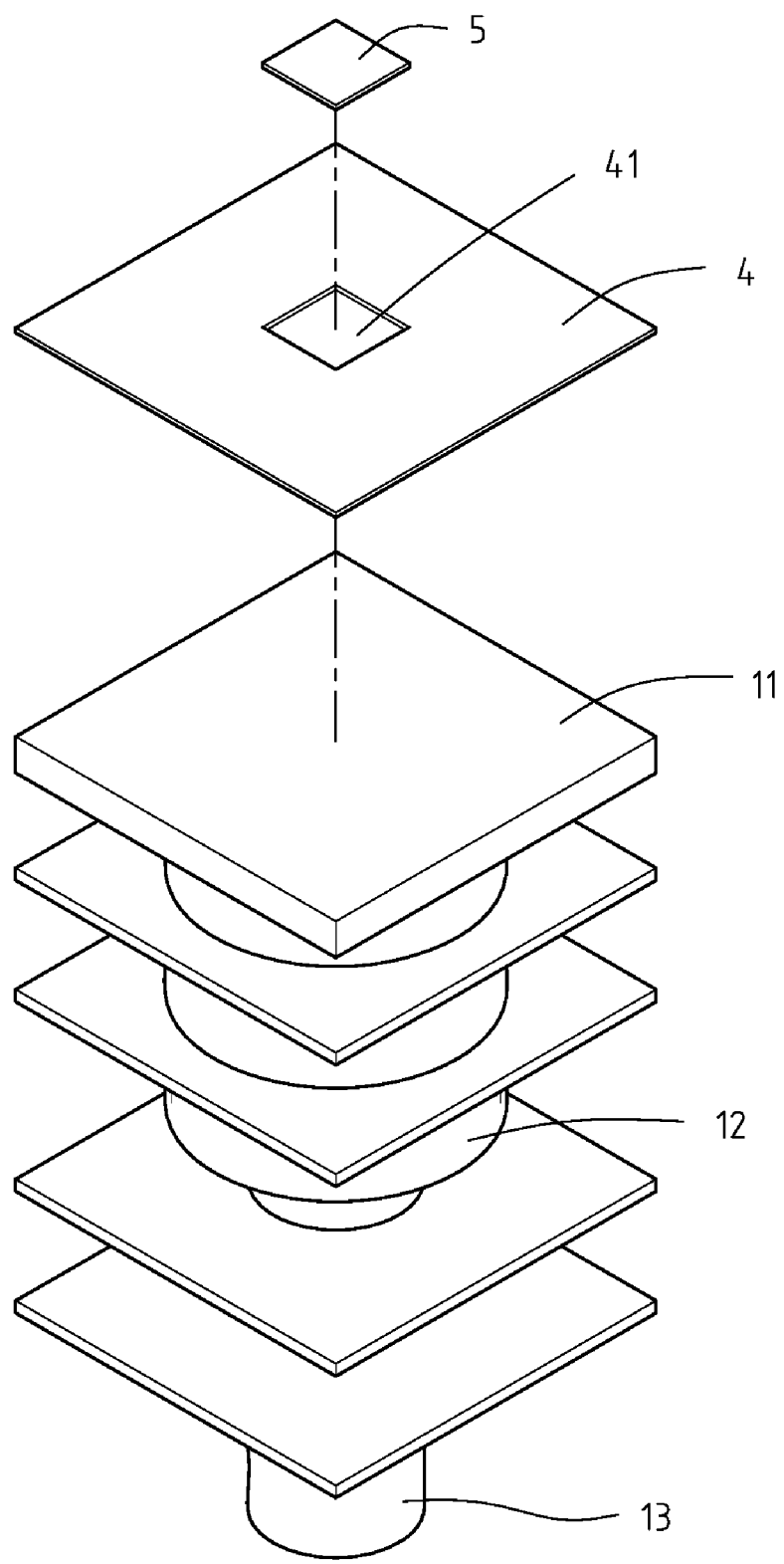
FIG. 14A is an exploded view of the finned heat pipe comprising concentric pipes of different length applied in IC design.
Figure 14B:
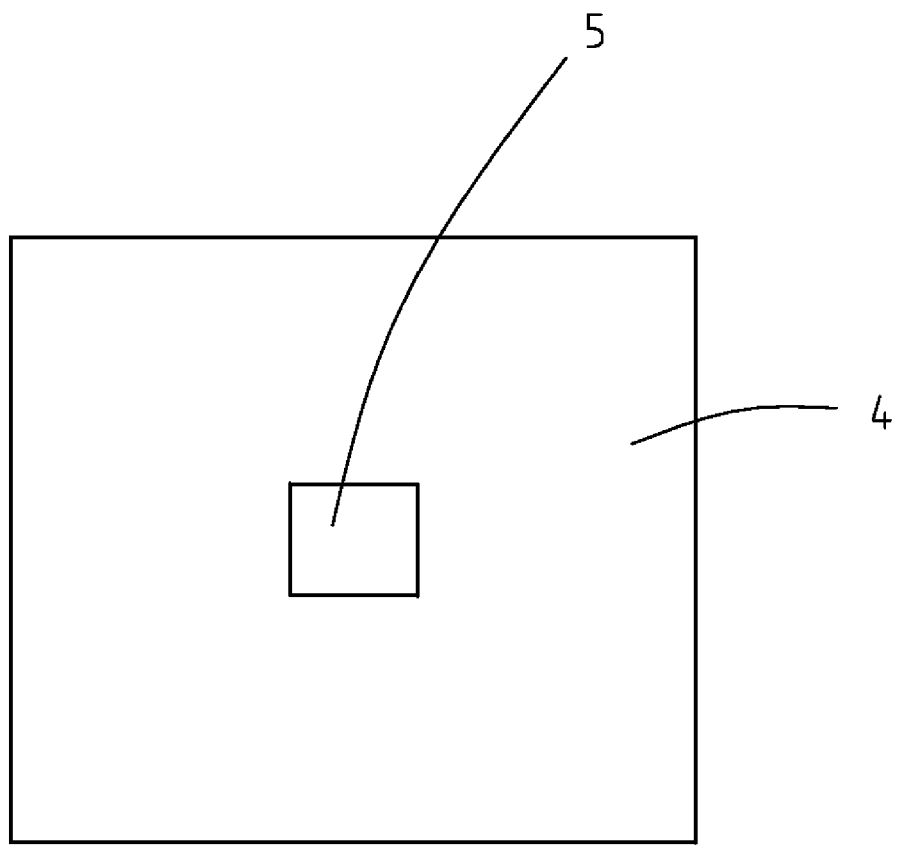
FIG. 14B is a top view of the finned heat pipe comprising concentric pipes of different length in FIG. 14A.

With reference to FIGS. 14A and 14B, the finned heat pipe comprising concentric pipes of different length may be applied in the field of IC design. An insulator (4) is mounted on the base (11) by sputtering, and the insulator (4) is made of SiC, Al2O3, or AlN. The insulator (4) has an opening (41), and an IC chip (5) is mounted on the base (11) in the opening (41). The IC chip (5) generates heat at high temperature when it is working. The finned heat pipe comprising concentric pipes of different length absorbs and dissipates heat generated by the IC chip (5).

Figure 15A:
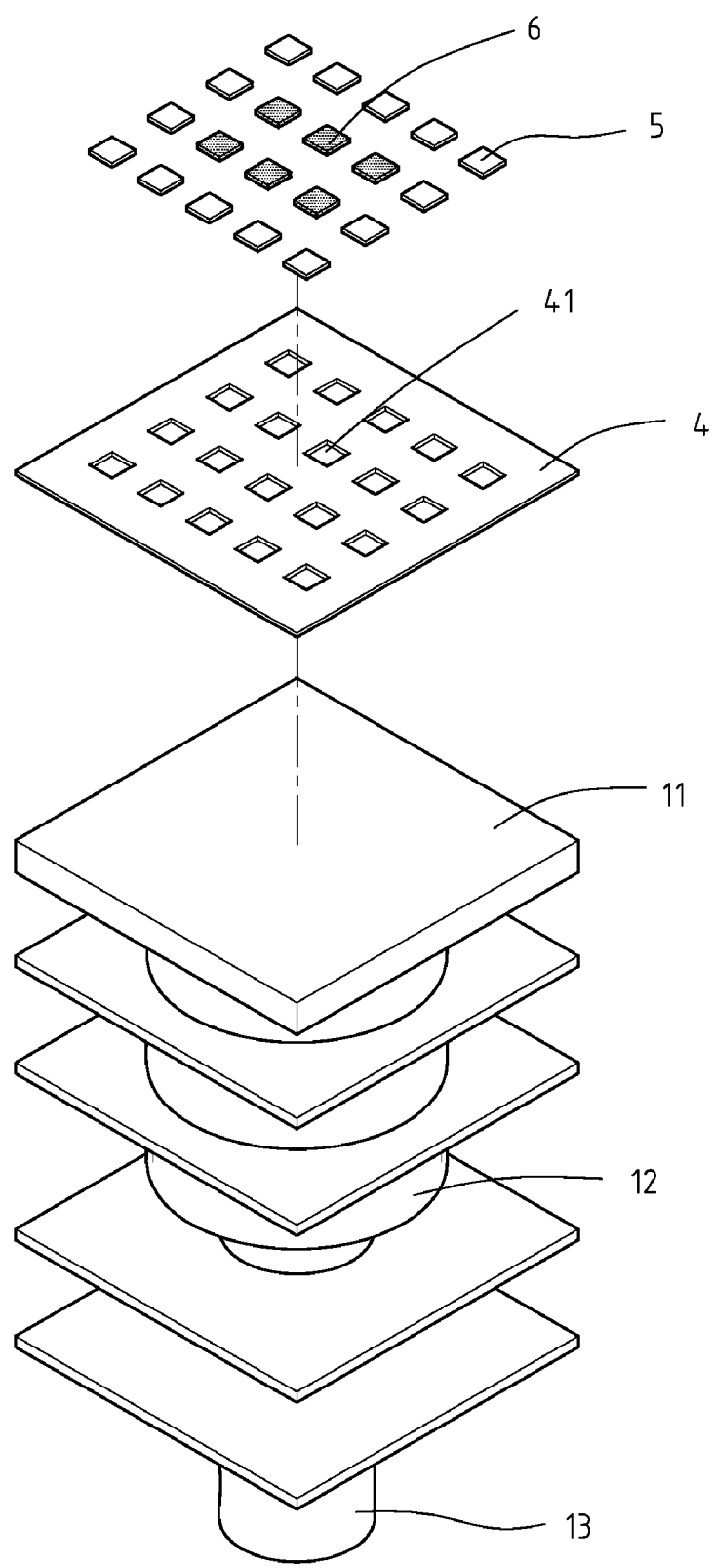
FIG. 15A is an exploded view of the finned heat pipe comprising concentric pipes of different length applied in LED module.
Figure 15B:
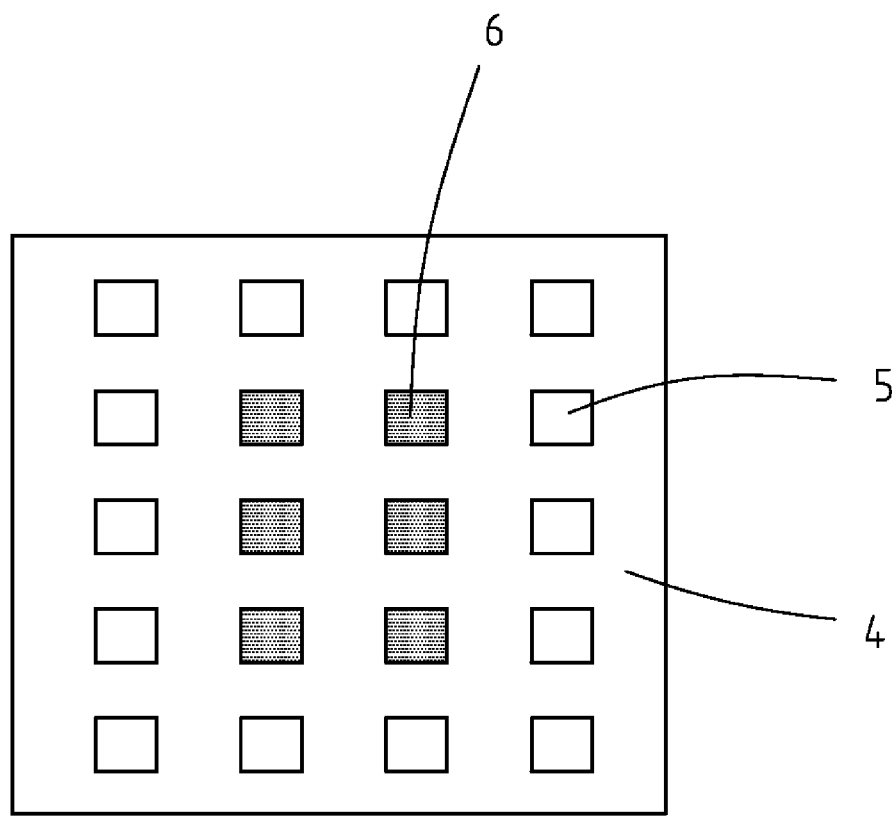
FIG. 15B is a top view of the finned heat pipe comprising concentric pipes of different length in FIG. 15A.

With reference to FIGS. 15A and 15B, the heat sink assembly finned heat pipe comprising concentric pipes of different length may be applied in LED module. Another insulator (4) is mounted on the base (11) by sputtering. The insulator (4) has multiple openings (41). Multiple IC chips (5) are mounted on the base (11) and in the surrounding openings (41). Multiple LED chips (6) are mounted on the base (11) and in the remaining openings (41). The finned heat pipe comprising concentric pipes of different length absorbs and dissipates heat generated from the multiple IC chips (5) and LED chips (6).

Figure 16:
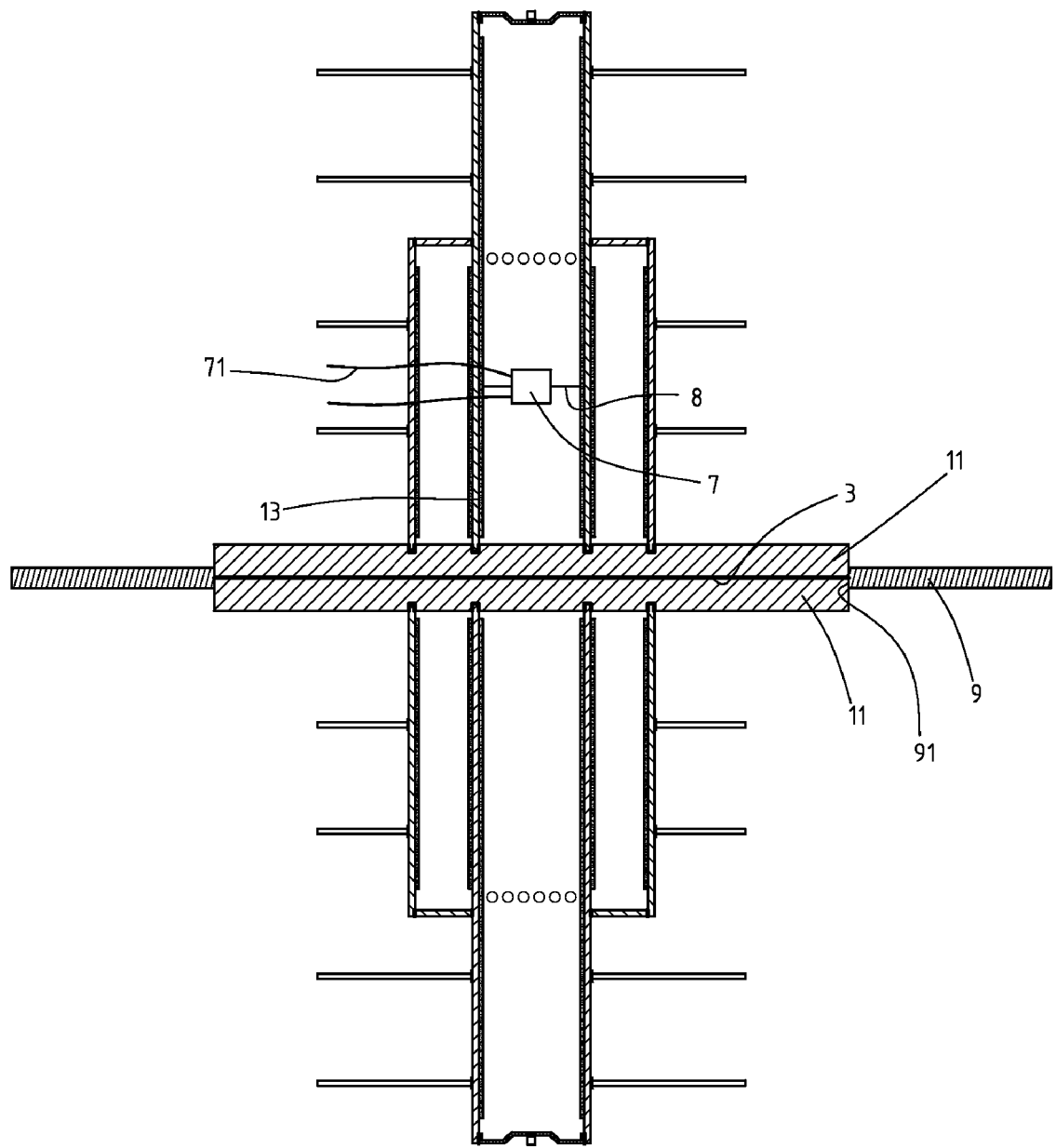
FIG. 16 is a cross sectional side view of the finned heat pipe comprising concentric pipes of different length applied in thermal energy recycling.

With reference to FIG. 16, the finned heat pipe comprising concentric pipes of different length may be applied in the field of thermal energy recycling such as waste heat, hot water, solar energy industry and so like. Solar energy is taken as an example here. Two finned heat pipes comprising concentric pipes of different length are used in the example. One comprises a generator (7), and the other does not. A holder (8) is mounted in the core pipe (13) of the finned heat pipe comprising concentric pipes of different length, and the generator (7) is mounted on the holder (8). The generator (7) has two wires (71) extending out of the finned heat pipe comprising concentric pipes of different length. The finned heat pipe comprising concentric pipes of different length with the generator (7) and the finned heat pipe comprising concentric pipes of different length without the generator (7) are placed on opposite sides of a plate (9) respectively. The plate (9) has an opening (91), and both heat sink assemblies contact with each other by the base (11) through the opening (91). Tin filler (3) is placed on the base (11) to solder both heat sink assemblies together.

The generator (7) in the core pipe (13) is turned off when both heat sink assemblies are not exposed to the sun. When the finned heat pipe comprising concentric pipes of different length with the generator (7) is exposed to the sun and absorbs thermal energy of the sun, the working fluid in the finned heat pipe comprising concentric pipes of different length with the generator (7) is vaporized to increase air pressure inside to drive the generator (7) to transform thermal energy to electricity. The generated electricity is then transmitted to an external electric device through the wires (71) for use.

At the same time, the finned heat pipe comprising concentric pipes of different length without the generator (7) is sheltered from the sun by the plate (9), absorbs thermal energy from the finned heat pipe comprising concentric pipes of different length with the generator (7) through the base (11) connection and dissipates thermal energy to prevent the generator (7) from overheating.

What is claimed is:

1. A finned heat pipe comprising concentric pipes of different length, comprising
   a base, being a plate of conductive metal and having
      a top surface; and
      two concentric circular grooves formed in the top surface and comprising
         an inner groove; and
         an outer groove;
   a core pipe, being cylindrical and a conductive metal, being copper-silver alloy brazed securely in the inner groove of the base with a gas-tight fit, protruding up from the base and comprising
      an inner surface;
      an outer surface;
      an open top;
      multiple holes formed around the core pipe away from the base; and
      a wick formed on the inner surface and outer surface between but not in contact with the base and the open top;
   an outer pipe, being cylindrical and a conductive metal, being copper-silver alloy brazed securely in the outer groove of the base with a gas-tight fit, protruding up from the base concentric with the core pipe and comprising
      an inner surface;
      an outer surface;
      an open top, being just above the multiple holes and being lower than the open top of the core pipe; and
      a wick being formed on the inner surface between but not in contact with the base and the open top; and
   a top cover, being copper-silver alloy brazed securely on and closing the open tops of the core pipe and the outer pipe; and
   a working fluid, being pure water and being injected into the core pipe and the outer pipe in the presence of a vacuum.

2. The finned heat pipe as claimed as claim 1, wherein the wick is a sintered-type wick being formed by sintering a large amount of metallic powder consistent with the core pipe on the inner surface and the outer surface of the core pipe and the inner surface of the outer pipe.

3. The finned heat pipe as claimed as claim 1, wherein the wick is a groove-type wick is multiple grooves formed longitudinally on the inner surface and the outer surface of the core pipe and the inner surface of the outer pipe.

4. The finned heat pipe as claimed as claim 1, wherein the wick is a mesh-type wick being a fine metallic mesh consistent with the core pipe and being mounted on the inner surface and the outer surface of the core pipe and the inner surface of the outer pipe.

5. The finned heat pipe as claimed as claim 1 further comprising multiple fins soldered on and protruding from the outer surface of the core pipe and being L-shaped, and each fin comprising
   an elongated fin; and
   a foot soldering to the outer surface with a low temperature tin filler.

6. The finned heat pipe as claimed as claim 1 further comprising multiple fins soldered on and protruding from the outer surface of the outer pipe and being L-shaped, and each fin comprising
   an elongated fin; and
   a foot soldering to the outer surface with a low temperature tin filler.

7. The finned heat pipe as claimed as claim 5 further comprising multiple fins soldered on and protruding from the outer surface of the outer pipe and being L-shaped, and each fin comprising
   an elongated fin; and
   a foot soldering to the outer surface with a low temperature tin filler.

8. The finned heat pipe as claimed as claim 5, wherein the fins are longitudinal radial fins.

9. The finned heat as claimed as claim 7, wherein the fins are circular fins.

10. The finned heat pipe as claimed as claim 8, wherein the fins are longitudinal radial fins.

11. The finned heat pipe as claimed as claim 8, wherein the fins are circular fins.

12. The finned heat pipe as claimed as claim 7, wherein the fins are longitudinal radial fins.

13. The finned heat pipe as claimed as claim 7, wherein the fins are circular fins.

* * * * *